(12) United States Patent
Yaman et al.

(10) Patent No.: US 11,043,786 B2
(45) Date of Patent: Jun. 22, 2021

(54) MULTICORE FIBER AMPLIFIER WITH HIGH POWER EFFICIENCY

(71) Applicant: NEC Laboratories America, Inc., Princeton, NJ (US)

(72) Inventors: Fatih Yaman, Princeton, NJ (US); Shaoliang Zhang, Princeton, NJ (US); Eduardo Mateo Rodriguez, Tokyo (JP); Kohei Nakamura, Tokyo (JP); Yoshihisa Inada, Tokyo (JP); Takanori Inoue, Tokyo (JP)

(73) Assignee: NEC CORPORATION

( * ) Notice: Subject to any disclaimer, the term of this patent is extended or adjusted under 35 U.S.C. 154(b) by 303 days.

(21) Appl. No.: 15/956,284

(22) Filed: Apr. 18, 2018

(65) Prior Publication Data

US 2018/0301864 A1 Oct. 18, 2018

Related U.S. Application Data

(60) Provisional application No. 62/486,701, filed on Apr. 18, 2017.

(51) Int. Cl.
| | | |
|---|---|---|
| *H01S 3/067* | (2006.01) |
| *G02B 6/44* | (2006.01) |
| *G02B 6/02* | (2006.01) |
| *H01S 3/23* | (2006.01) |
| *H01S 3/094* | (2006.01) |
| *H01S 3/16* | (2006.01) |
| *H01S 3/0941* | (2006.01) |
| *H01S 5/10* | (2021.01) |
| *H01S 5/20* | (2006.01) |
| *H01S 5/40* | (2006.01) |

(52) U.S. Cl.
CPC ...... *H01S 3/06737* (2013.01); *G02B 6/02042* (2013.01); *G02B 6/4427* (2013.01); *H01S 3/094053* (2013.01); *H01S 3/2383* (2013.01); *H01S 5/4031* (2013.01); *H01S 3/0941* (2013.01); *H01S 3/094003* (2013.01); *H01S 3/1608* (2013.01); *H01S 3/1618* (2013.01); *H01S 5/1007* (2013.01); *H01S 5/2036* (2013.01)

(58) Field of Classification Search
CPC .. H01S 3/06737; H01S 5/4031; H01S 5/1007; H01S 5/2036
See application file for complete search history.

(56) References Cited

U.S. PATENT DOCUMENTS

| 5,566,196 A | * | 10/1996 | Scifres | G02B 6/02042 372/6 |
| 7,289,707 B1 | * | 10/2007 | Chavez-Pirson | G02B 6/06 385/116 |
| 9,250,385 B1 | * | 2/2016 | Onaka | H01S 3/06737 |
| 2009/0042327 A1 | * | 2/2009 | Nakatsuka | H01S 5/4031 438/31 |

(Continued)

*Primary Examiner* — Eric L Bolda
(74) *Attorney, Agent, or Firm* — Joseph Kolodka

(57) ABSTRACT

Aspects of the present disclosure describe systems, methods, and structures that advantageously amplify optical signals through the effect of optical pump signals generated by a multicore laser diode and multicore rare-earth doped optical fiber in optical communication with a 3D waveguide structure and a multicore input signal fiber providing a plurality of optical signals for amplification.

8 Claims, 12 Drawing Sheets

(56) References Cited

U.S. PATENT DOCUMENTS

| | | | | |
|---|---|---|---|---|
| 2014/0036351 A1* | 2/2014 | Fini | ............... | H01S 3/094057 359/341.31 |
| 2015/0063740 A1* | 3/2015 | Gotoda | ............. | H01S 5/4012 385/2 |
| 2015/0085352 A1* | 3/2015 | Ryf | ................. | H01S 3/06737 359/341.33 |
| 2017/0279242 A1* | 9/2017 | Yaman | ............. | H01S 3/1608 |

* cited by examiner

COMPONENT FOR SUBMARINE CABLE SYSTEM

BROAD AREA LASER DIODE

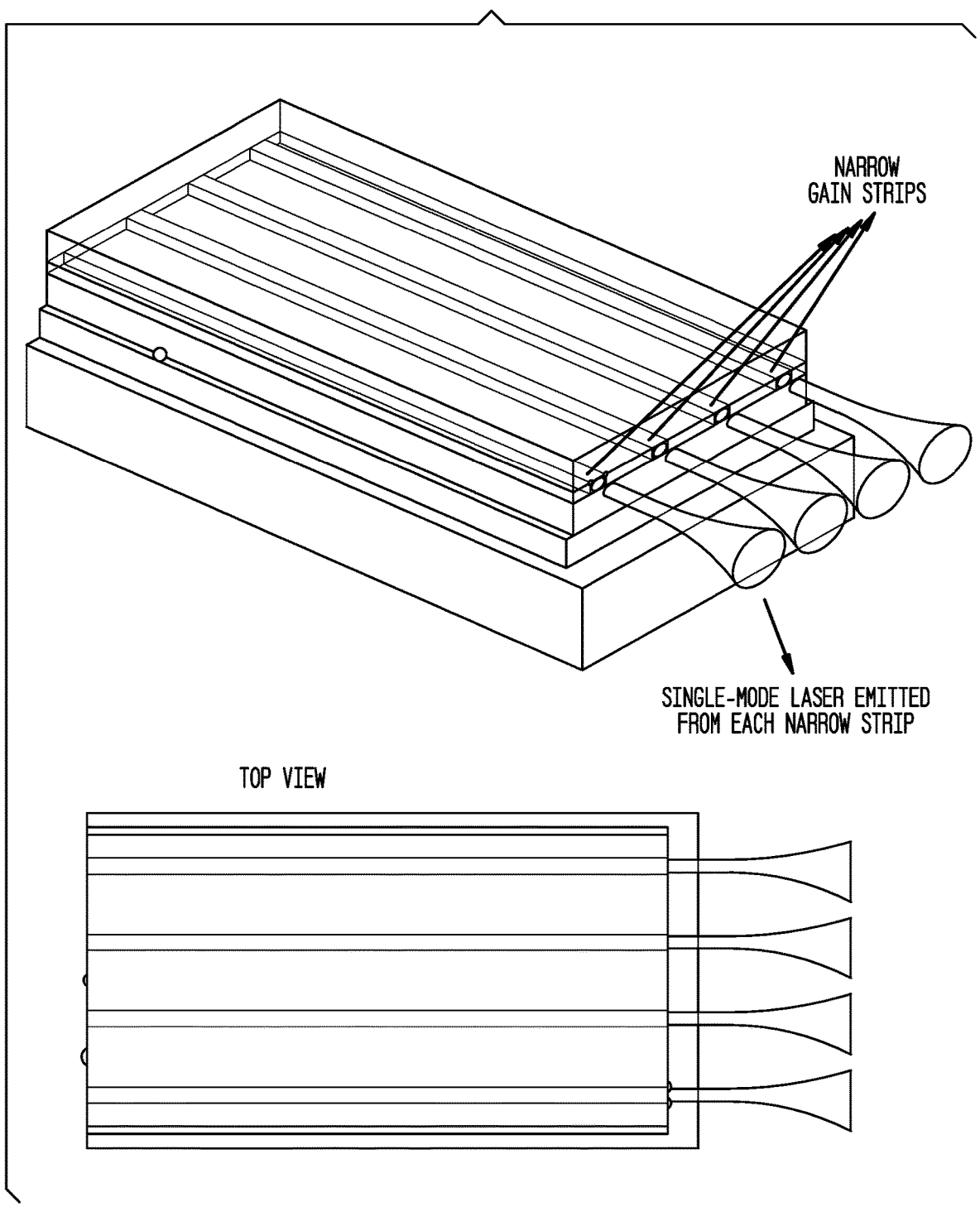

FIG. 7A
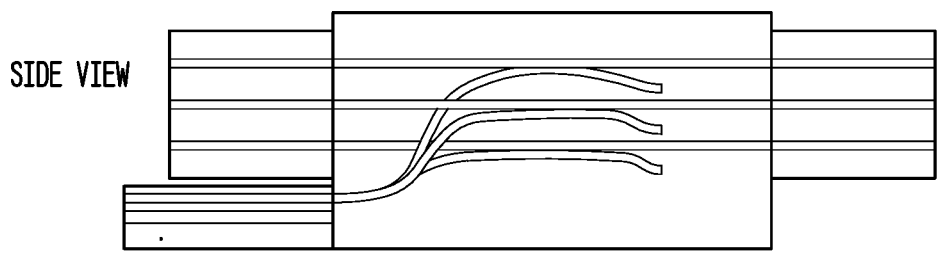
SIDE VIEW
FIG. 7B
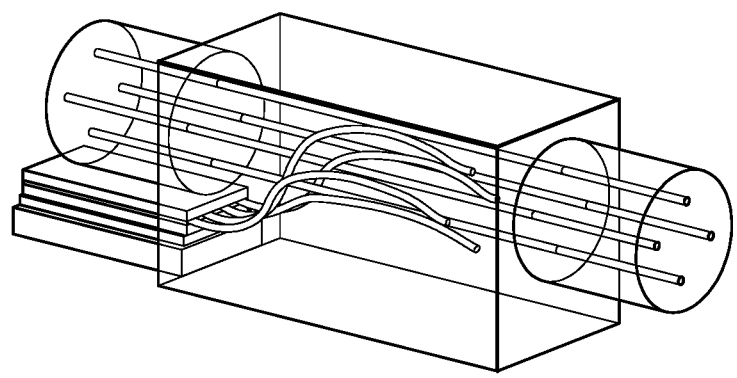
FIG. 7C
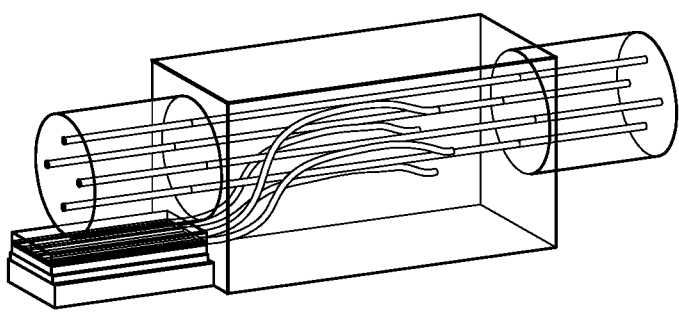
FIG. 7D     TOP VIEW
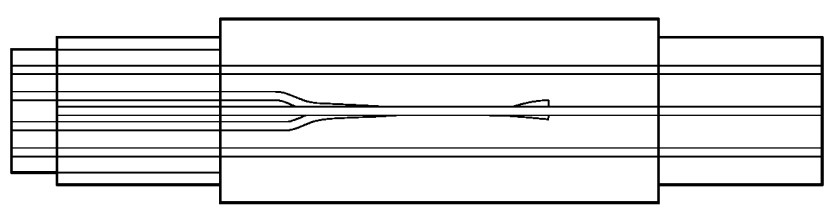

PUMP LIGHT IS TRANSFERRED TO THE SIGNAL CORES

SIGNALS AND PUMPS ARE LAUNCHED INTO THE MC-EDF

MC-EDF

MULTICORE FIBER AMPLIFIER WITH HIGH POWER EFFICIENCY

CROSS REFERENCE TO RELATED APPLICATIONS

This application claims the benefit of U.S. Provisional Patent Application Ser. No. 62/486,701 filed Apr. 18, 2017 which is incorporated by reference as if set forth at length herein.

TECHNICAL FIELD

This disclosure relates generally to optical communications and more specifically to erbium doped fiber amplifiers (EDFAs) exhibiting an increased power efficiency and low complexity.

BACKGROUND

As is known, deploying new optical fiber for optical communications facilities and networks constructed therefrom is quite expensive. Consequently, the art has expended considerable intellectual and financial capital developing and/or deploying technologies that facilitate and/or enhance transmission capacity of existing facilities. Notwithstanding this considerable expenditure, there remains a continuing need for systems, methods, and structures that enhance the transmission capacity and information carrying ability of optical communications networks and such systems, methods, and structures would represent a welcome addition to the art.

SUMMARY

An advance in the art is made according to aspects of the present disclosure directed to systems, methods, and structures employing advanced erbium-doped fiber amplifiers exhibiting—in sharp contrast to the prior art—improved power efficiency and low complexity while imposing low negative impact(s) on system components with which they interoperate.

Viewed from one aspect, the present disclosure is directed to a multicore fiber amplifier comprising: a multicore input signal fiber; a 3D waveguide section in optical communication with the multicore input signal fiber; a multicore laser diode in optical communication with the 3D waveguide section; and a multicore rare-earth doped fiber section in optical communication with the 3D waveguide section; wherein optical signals input via the multicore input signal fiber are combined with pump light emitted from the multicore laser diode and amplified in the rare-earth doped fiber section.

BRIEF DESCRIPTION OF THE DRAWING

A more complete understanding of the present disclosure may be realized by reference to the accompanying drawing in which:

FIG. 6 is a schematic diagram showing top and perspective view(s) of an illustrative multi-core laser diode (MC-LD) as a monolithic laser diode with multiple gain strips according to aspects of the present disclosure;

FIG. 7(A), FIG. 7(B) FIG. 7(C) and FIG. 7(D) is a series of schematic diagrams showing side (FIG. 7(A),) top (FIG. 7(D)) and perspective (FIG. 7(B), FIG. 7(C)) views of an illustrative MC-LD according to aspects of the present disclosure;

DESCRIPTION

Figure 1:
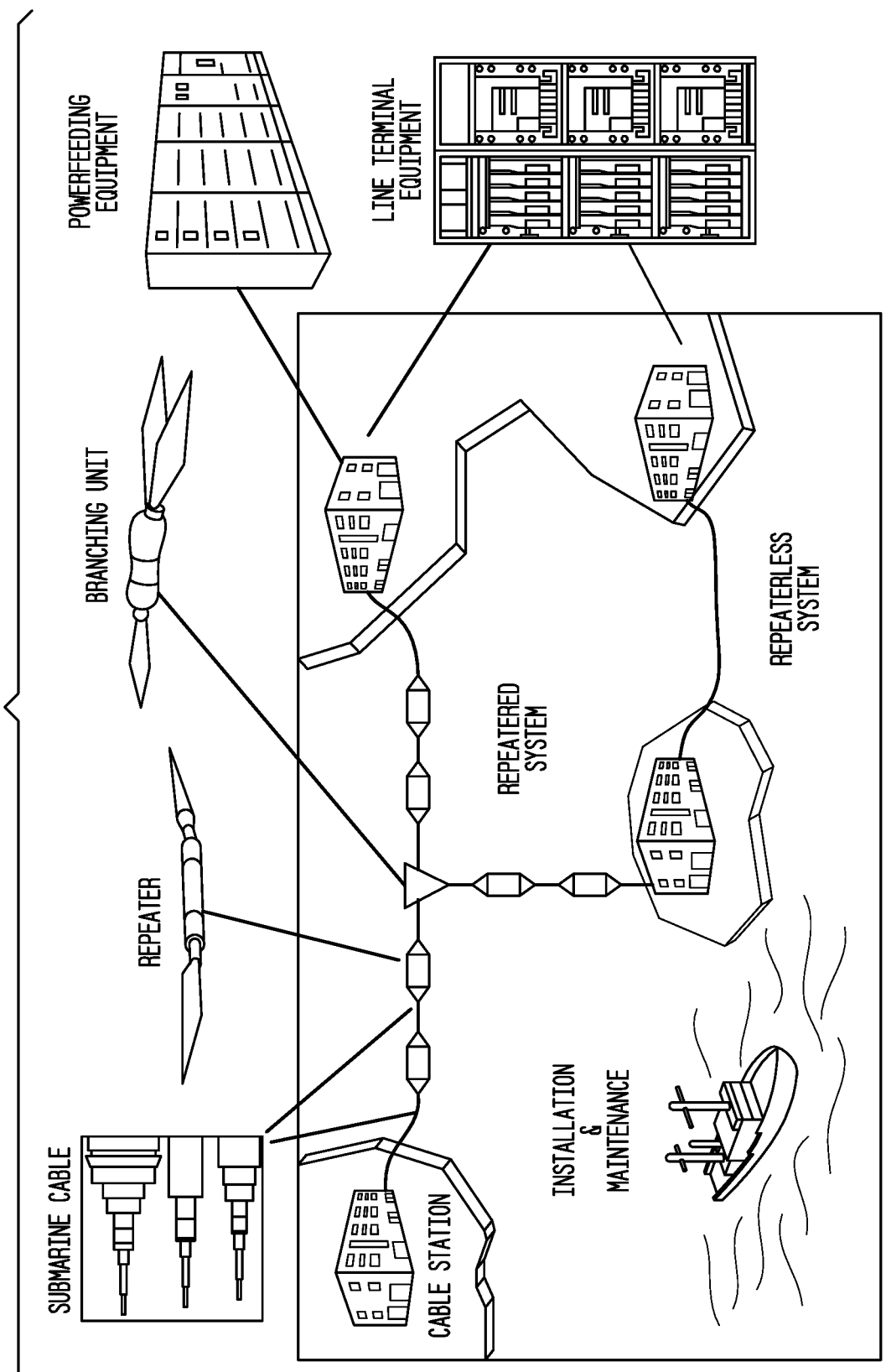
FIG. 1 is a schematic diagram showing illustrative submarine cable systems.

The following merely illustrates the principles of the disclosure. It will thus be appreciated that those skilled in the art will be able to devise various arrangements which, although not explicitly described or shown herein, embody the principles of the disclosure and are included within its spirit and scope.

Furthermore, all examples and conditional language recited herein are principally intended expressly to be only for pedagogical purposes to aid the reader in understanding the principles of the disclosure and the concepts contributed by the inventor(s) to furthering the art, are to be construed as being without limitation to such specifically recited examples and conditions.

Moreover, all statements herein reciting principles, aspects, and embodiments of the disclosure, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Unless otherwise explicitly specified herein, the FIGS. comprising the drawing are not drawn to scale.

By way of some additional background, we note that submarine optical transmission systems—also known as submarine cable systems—are arguably the true backbone of world-wide communications. Much of the data that travels between contents are delivered via these cable/transmission systems that are laid on sea beds. As will be readily appreciated by those skilled in the art, there are several aspects of submarine transmission and systems that set(s) it apart from other communications systems—including optical fiber systems.

First, it is very expensive to lay under sea cables. Second, once such cable(s) is/are laid, it is extremely expensive to replace, upgrade, service, and/or repair such cables. Finally, all power (electricity) required to operate the cable systems must be supplied from the end(s) of the cable as there are no known power sources under sea.

Since—as we have noted—it is so very expensive to lay undersea cables and/or upgrade/replace/service them, technologies that allow the transmission of a maximum amount of data using a given cable are crucial—since expenses associated with undersea cable deployment are recovered by selling data capacity (cost/bit). One aspect of the present disclosure is therefore to reduce the cost/bit. We advantageously accomplish this by increasing the capacity of undersea cables.

Turning now to FIG. 1, there is shown a schematic of an illustrative undersea cable system. As may be observed, data to be carried by the undersea system originates at one of the cable stations and is delivered to other cable station(s) via one or more span(s) of submarine cable. As will be readily known and appreciated by those skilled in the art, submarine cable(s) include several component parts namely 1) a cable span and 2) repeaters.

Generally, a cable span may be on the order of 40 km to 150 km—or longer—in length but are typically in the 50-80 km range. As will be further known and appreciated, such cable span(s) include several elements as shown in that figure.

Arguably, the most important component of a cable span is the optical fiber. Optical fibers are very thin strands of glass that guide light with—usually—low attenuation. Optical fibers are very thin, typically exhibiting a diameter of only about 250 microns.

Most undersea cable systems include multiple, individual fibers in a given span. Since each fiber may carry data, a capacity of a given span is proportional to the number of individual fibers in a given cable span. In theory, the data carrying capacity of a given span may be increased by adding additional individual fibers, however this is not the case as power limitations prevent such scaling. Additionally—even given the relatively low attenuation (loss) of contemporary optical fiber—the optical power conveyed by a fiber nevertheless drops throughout a span—oftentimes by 1% or more.

To address such attenuation, active optical amplifiers are employed in repeater elements of the undersea optical transmission system. Within such repeaters there is oftentimes one amplifier dedicated to each individual optical fiber. One limitation of such configuration(s) is that the number of fibers that can be supported by an undersea cable system is largely determined by the number of amplifiers that can be physically enclosed within a given repeater.

Still another limitation of repeater design/deployment is electrical power limitations. As noted, each amplifier requires electrical power to operate and such electrical power must be supplied from the end(s) of the optical cable—which cable maybe several thousands of km in length. Such electrical power so supplied is limited due—in part—to electrical conducting elements included in the undersea cable. Consequently, such limited power is necessarily shared by all amplifiers in a given undersea system.

Accordingly, systems, methods and structures according to the present disclosure that improve the power efficiency of optical amplifiers employed in undersea and other optical systems will directly—and quite positively—affect cable capacity and therefore its characteristic cost/bit.

Those skilled in the art will appreciate that optical fibers may advantageously carry independent data at different wavelengths. Such different wavelength transmission is generally known as wavelength division multiplexing (WDM). Given WDM techniques, the information carrying capacity of a given cable maybe increased by employing more individual wavelengths of light in a given fiber. Such increase is not unlimited however as optical fibers exhibit a wavelength-dependent attenuation.

More specifically, and by way of illustrative example only, the attenuation maybe low for a limited number of wavelengths between 1510 nm and 1620 nm, beyond which attenuation becomes large. Still another limitation is that optical amplifiers exhibit a limited bandwidth. In particular—in optical submarine communications systems employing optical amplifiers—such amplifiers so employed are typically EDFAs which may cover only approximately 30-40 nm of overall bandwidth carried by a given fiber.

Figure 2:
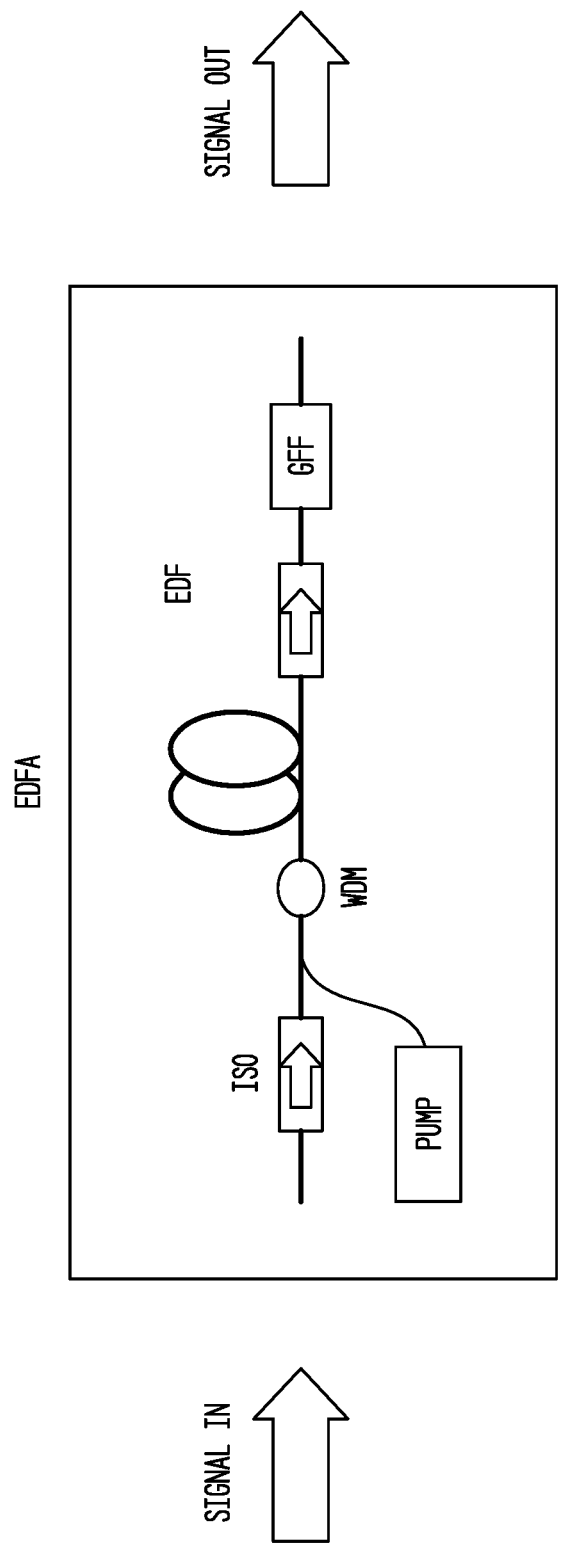
FIG. 2 is a schematic diagram showing an illustrative EDFA according to aspects of the present disclosure.

FIG. 2 is a schematic of an illustrative EDFA showing: erbium-doped fiber (EDF), gain flattening filter (GFF), isolator (ISO), and wavelength division multiplexing coupler (WDM). We note—and as will be readily understood by those skilled in the art, as optical networks have continued to develop for longer distances and higher speeds, fiber-optic communication is mainly conducted in a wavelength region where optical fibers exhibit small(er) transmission loss(es). This low-loss wavelength region ranges from 1260 nm to 1625 nm and is divided into five wavelength bands referred in the art as the "O", "E", "S", "C", and "L" bands.

Among these five bands, the O-band (original band: 1260-1360 nm) was historically the first wavelength band used for optical communication, because signal distortion (due to chromatic dispersion) is minimal. It was also because optical fibers produced in the mid-1970s showed its lowest loss near the O-band.

Today, contemporary optical fibers show its lowest loss in the C-band (conventional band: approximately 1530-1565 nm), and thus is commonly used in many metro, long-haul, ultra-long-haul, and submarine optical transmission systems combined with WDM and EDEA technologies.

The L-band (long-wavelength band: approximately 1565-1625 nm) is the second lowest-loss wavelength band and is a popular choice when the use of the C-band is not sufficient to meet the bandwidth demand. The same WDM and EDFA technologies can be applied to the L-band. Given their applicability to submarine systems and compatibility with WDM and EDFA technologies, C-band and L-band transmissions are most commonly used in undersea systems.

Accordingly, with reference to FIG. 2, signals exhibiting C- or L-band wavelengths enter the EDFA wherein a WDM coupler combines the signals with pump laser output into the EDF. Generally, such pump laser output wavelengths are either at 980 or 1480 nm—or another wavelength. The WDM coupler ensures that all pump power is transferred from the fiber conveying pump laser light into the EDF. In the EDF, the power from the pump laser is transferred to the signal and an amplified signal results as an EDFA output signal.

Figure 3:
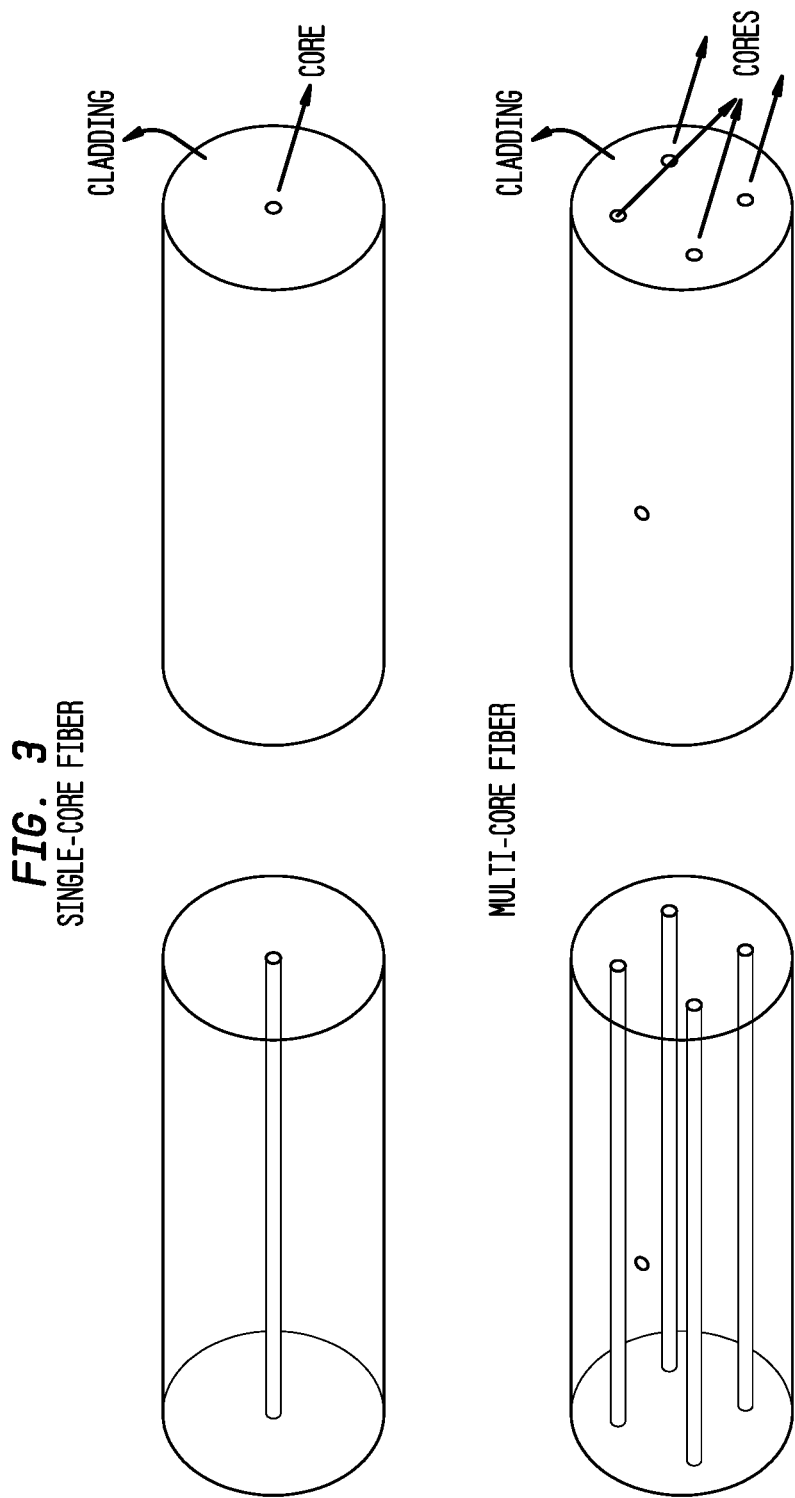
FIG. 3 is a schematic diagram showing illustrative single-core and multi-core fibers according to aspects of the present disclosure.

At this point a few points regarding the EDFA and systems, methods, and structures according to the present disclosure is appropriate. First, fibers in EDFAs are typically single-mode fibers and have a single core. As will be understood and appreciated, single core means there is only one region of the fiber inside a fiber strand that is designated to carry light. Such a designated region is known as the core of the fiber. Conversely, multi-core fibers include multiple cores. FIG. 3, is a schematic drawing showing illustrative single- and multi-core optical fibers. As may be observed from that figure, the core(s) is/are interior to a cladding which serves to guide the light along the core(s) through the effect of total internal reflection as is known. Typically, a fiber core diameter is about 10 micrometers.

With respect to the structures shown in FIG. 2, the pump laser light is guided in the core of the fiber and the signal light is guided in the core of the incoming fiber. The WDM coupler combines the light(s) guided in these two fibers at the core of the EDF. We note that in the terminology of optical communications, single mode (single "modedness") refers to a beam quality of light within a fiber core. In single-mode fibers, the beam quality is a maximum. In multi-mode fibers, light travels in different spatial modes, and in general since the coherence cannot be maintained between the different modes the beam quality is not as good as that with single mode fibers.

Note also that one major source of power consumption in amplifiers is the laser pump. With additional reference to FIG. 2, it will be understood that the EDFA shown in that figure converts laser output of the pump to signal power. Such pumps are typically laser diodes. Since pump diodes convert electrical power into optical power the efficiency of such pump diodes (how efficiently the electrical power is converted to optical power) directly affects the power efficiency of the EDFA.

Those skilled in the art will understand and appreciate that pump laser(s) must be chosen carefully in order to ensure that optical signals are amplified efficiently, with low noise. One important criterion to achieve low noise amplification is that the pump laser should be single mode (SM). This is important because when the pump laser output is combined with the signal inside the EDF, signal and pump light should exhibit a sufficient overlap. Since applied optical signal(s) are typically single mode, to achieve a good overlap between signal and pump the pump too should be single mode—or as close to single mode as practically possible. While such pump single modedness is highly desirable, it is well known that single mode pump lasers are not as power efficient as multi-mode (MM) pump lasers. As specific illustrative example, SM pump lasers may only exhibit a 30-35% power efficiency, while the MM pumps lasers may exhibit more than 50% efficiency.

One reason why MM pumps have such higher efficiency is because they exhibit lower resistance. MM laser diodes (LD—which may be used to refer to a pump laser in this disclosure) exhibit a larger gain area and larger contact area which reduces the resistance. Therefore, there is a trade-off between power efficiency and noise performance of an amplifier.

As we shall show and describe, systems, methods, and structures according to the present disclosure provide an advantageous trade-off benefit(s) as compared to the prior art.

Still another property of MM-LDs is that they provide higher output power than single-mode LDs (SM-LDs). For instance, a single MM-LD can provide the same output power that can be obtained from 10 or more SM-LDs. Noting that in many applications—including submarine transmission systems—there are multiple amplifiers packed into the same enclosure—shown schematically in FIG. 4.

Figure 4:
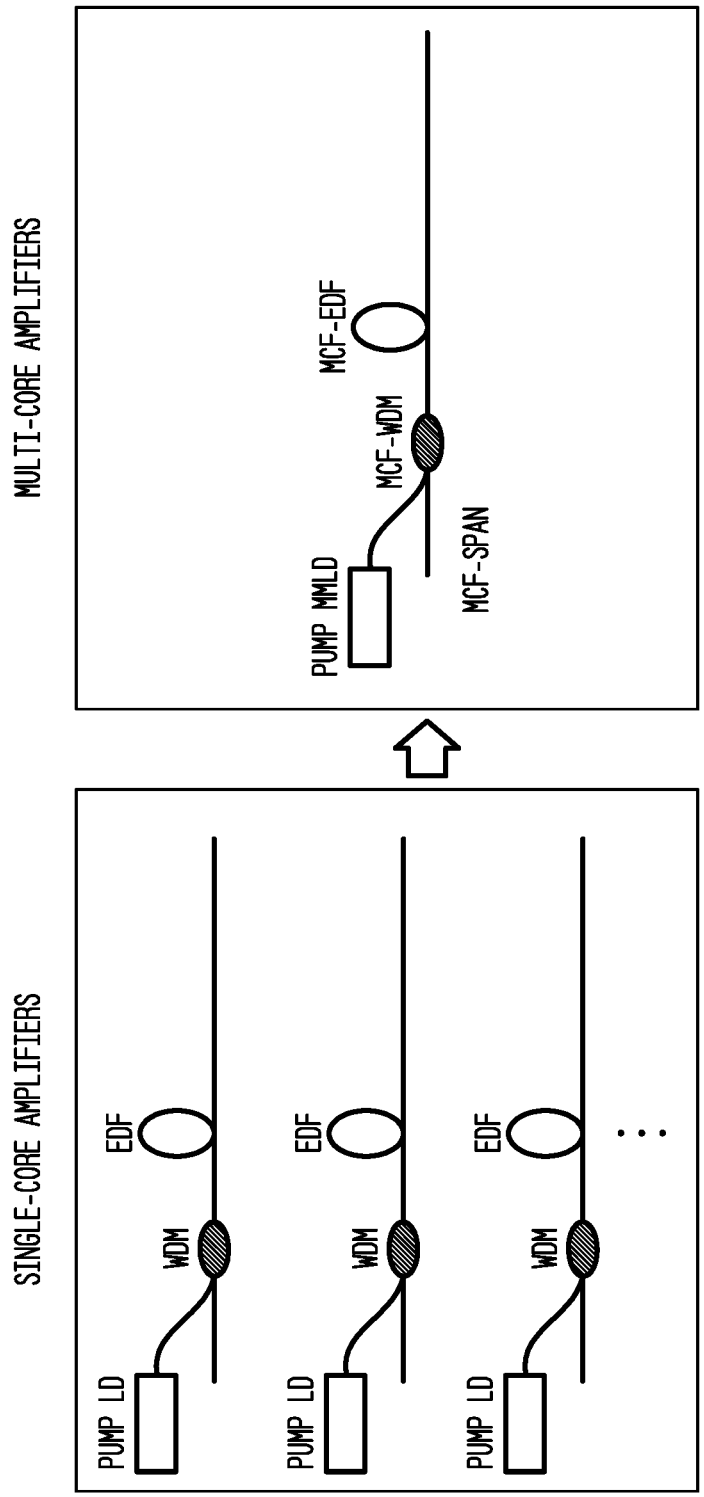
FIG. 4 is a schematic diagram showing: (left) illustrative single-core amplifier; and (right) corresponding multi-core amplifier with an equivalent number of amplifiers according to aspects of the present disclosure.

With reference to that FIG. 4, there is shown schematic diagrams illustrating single-core amplifiers and a multi-core amplifier having an equivalent number of amplifiers. As may be readily observed from inspection of that figure, the multi-core amplifier is a much more compact configuration than the single-core configuration—when each have the same number of amplifiers.

In the case of a submarine system, all amplifiers needed for all fibers are enclosed in the repeaters comprising the submarine system. For instance, we assume that a repeater houses 8 amplifiers corresponding to 4 fiber pairs. Instead of using 8 separate SM-LDs for the 8 amplifiers, one can use only a single MM-LD which may advantageously exhibit sufficient total power. However, as mentioned before, the output of the MM-LD would be multimode. Even thou it may be possible, it would be very difficult to separate the multimode output of the ML-LD into 8 separate single-mode pump laser(s). If this could be easily achieved, one could enjoy the high power efficiency of the MM-LD and—at the same time by keeping both signal and pump single mode inside the multicore EDF—one could enjoy low noise amplification.

As an additional side note, the most typical implementation of a MM-LD is a so-called broad area laser diode (BALD). It is well known that BALDs provide high power with a good efficiency, however then also exhibit a less than desirable beam quality. In other words, they are highly multimode. As noted however, BALDs exhibit a large gain area—which results from the large width of the gain medium. This gain area is sometimes called a gain strip. Note that the multi-mode aspect of the BALDs result from the wide width of the gain strip. Simply stated, by controlling the width one can change between MM-LD and SM-LD, however as mentioned previously, by increasing the gain width the power efficiency is also increased however the beam quality suffers.

Figure 5:
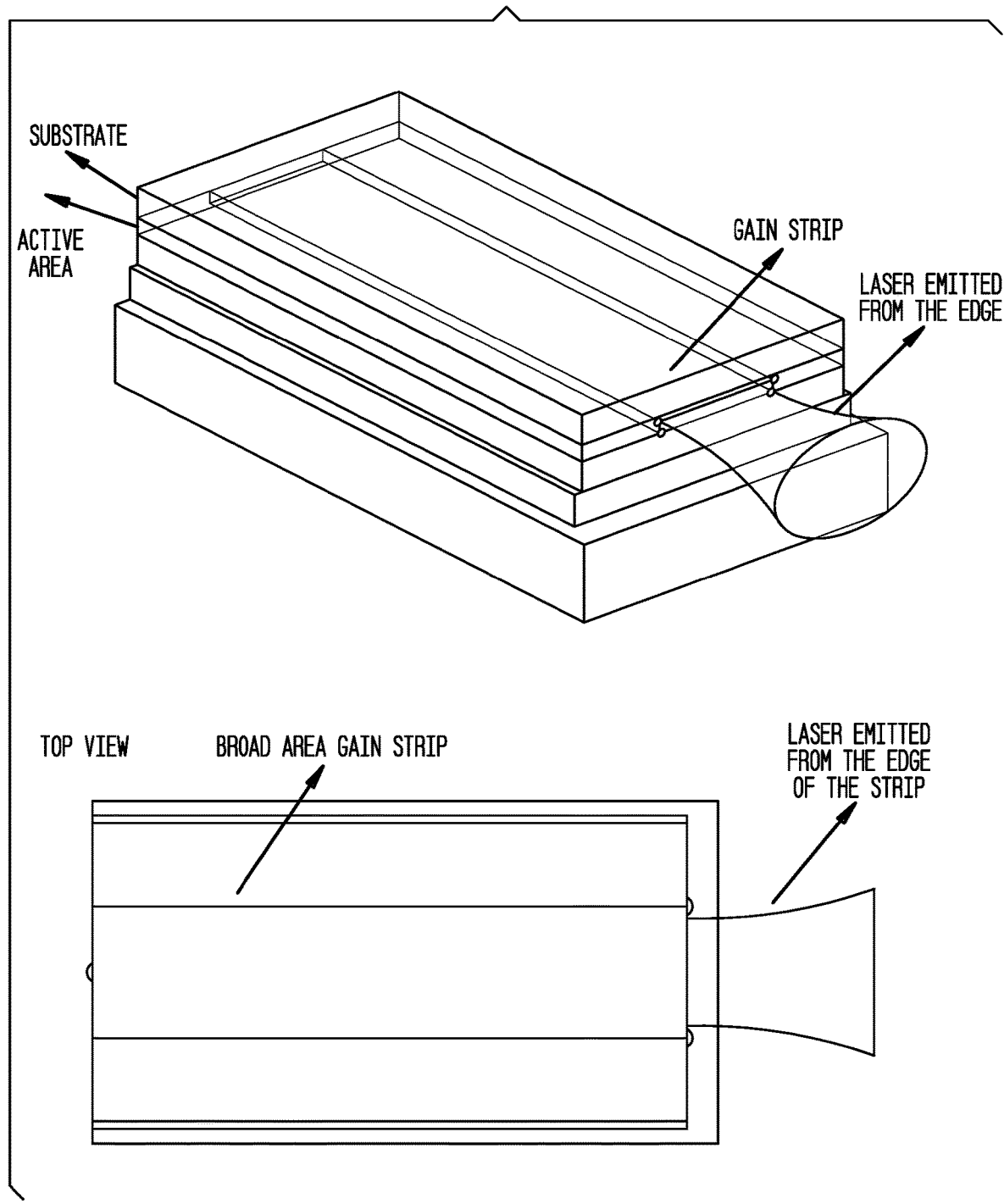
FIG. 5 is a schematic diagram showing top and perspective view(s) of an illustrative multi-mode laser diode (MM-LD) in a broad area laser diode configuration according to aspects of the present disclosure.

FIG. 5 is a schematic diagram showing perspective and top view(s) of an illustrative broad area laser diode according to aspects of the present disclosure. As may be observed from that illustrative structure, the laser light is emitted from the edge of the gain strip.

Yet another alternative, illustrative laser configuration according to the present disclosure is shown schematically in FIG. 6 which is a schematic of an illustrative multicore laser diode in both perspective and top views exhibiting a monolithic structure with multiple gain strips. As may be observed from that figure, the wide gain strip of the structure of FIG. 5 is illustratively split into multiple, narrow strips (NSs). Advantageously, such a narrow strip multicore laser diode provides a single mode, high-quality output laser beam while still retaining several advantages of the BALDs described previously.

More particularly, a narrow strip multicore laser diode exhibits a wide contact area and resulting low resistance resulting in improved power efficiency. Note that in high power laser applications, it is important that the output of each NS remains coherent with its neighboring strips, and—as a result—a variety of designs of varying complexity have been configured to achieve such design. For our specific applications however—including undersea cable systems—such "adjacent coherence" is not required thereby making the design of LDs for our applications simpler. In the art, namely the semiconductor laser diode community—monolithic lasers having multipers have been called by a number of different names including single emitter arrayed lasers (SEALs), however to keep the terminology consistent with the optical communications community, we refer in this disclosure to such LDs as multicore laser diodes (MC-LDs). Note that the output of each individual strip may be single mode or slightly multimode.

We note that such MC-LDs—according to the present disclosure—are used as replacement of SM-LDs resulting in improved power efficiency and high beam quality—particularly in undersea applications.

Figure 8:
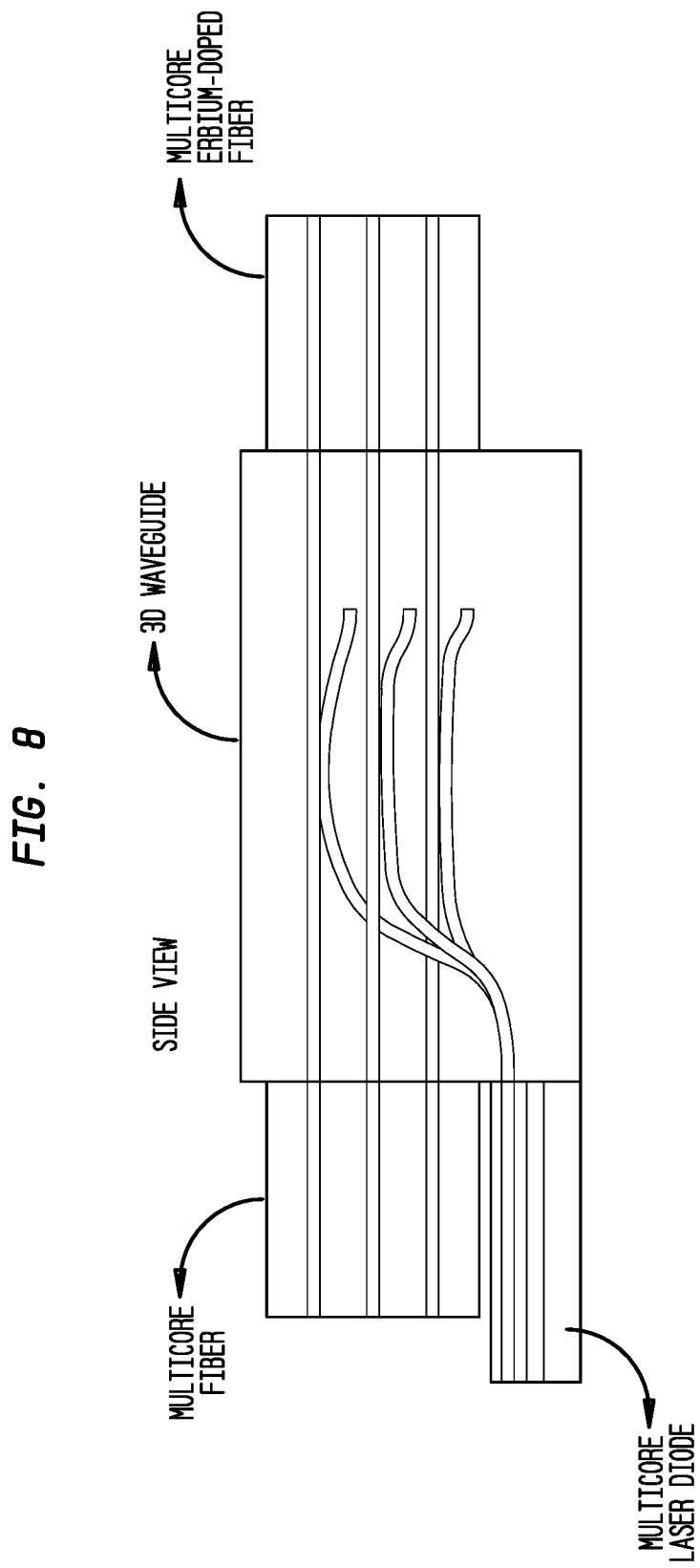
FIG. 8 is a schematic diagram showing a side view and components of an illustrative MC-LD according to aspects of the present disclosure.

Turning now to FIG. 7(A), FIG. 7(B), FIG. 7(C), and FIG. 7(D), there is shown several views of a schematic diagram of an illustrative MC-LD according to aspects of the present disclosure that may be employed in undersea (or other) amplifier applications. As may be observed from those several views, each individual output of the MC-LD is coupled into a respective fiber comprising the optical communications system. FIG. 8 illustrates the different parts of such MC-LD including the MC-LD, multicore fiber, 3D-waveguide, and multicore Erbium doped fiber.

With continued reference to that figure, it may be observed and understood that the multicore fiber conveys optical signals into the structure. Different optical signals (i.e., data carrying signals) are guided into the multiple cores which number for in this illustrative example. Of course, those skilled in the art will appreciate that a different number of cores—i.e., more—may be employed in a given configuration.

Disposed along a bottom of the structure, the MC-LD having 4 (or more) cores, each emitting a pump laser light in single mode that is subsequently coupled to the fiber(s). The pump laser light is preferably single mode—or nearly single mode. Both the pump laser light and signal lasers are launched into allocated waveguides inside the 3D waveguide (3D-WG).

As may be appreciated, there are several ways to make such as 3D-WG. One particularly notable aspect of the structure shown illustratively in FIG. 8 is that arbitrary shaped waveguides may be formed to guide light resulting and a controllable designed path.

Figure 9A:
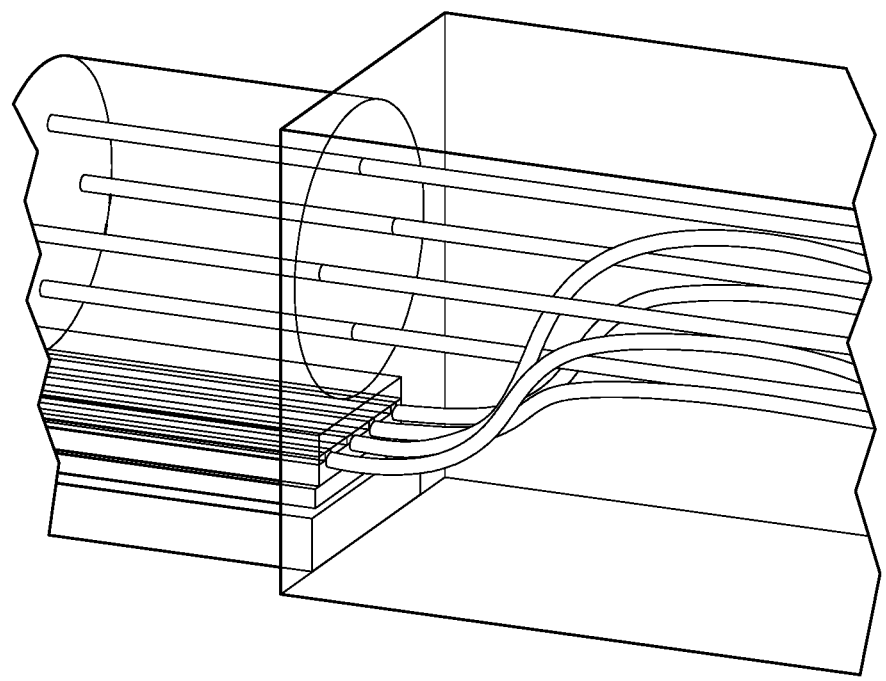
FIG. 9(A) and FIG. 9(B) is a series of schematic diagrams illustrating how signals and pumps are coupled into a 3D waveguide according to aspects of the present disclosure.
Figure 9B:
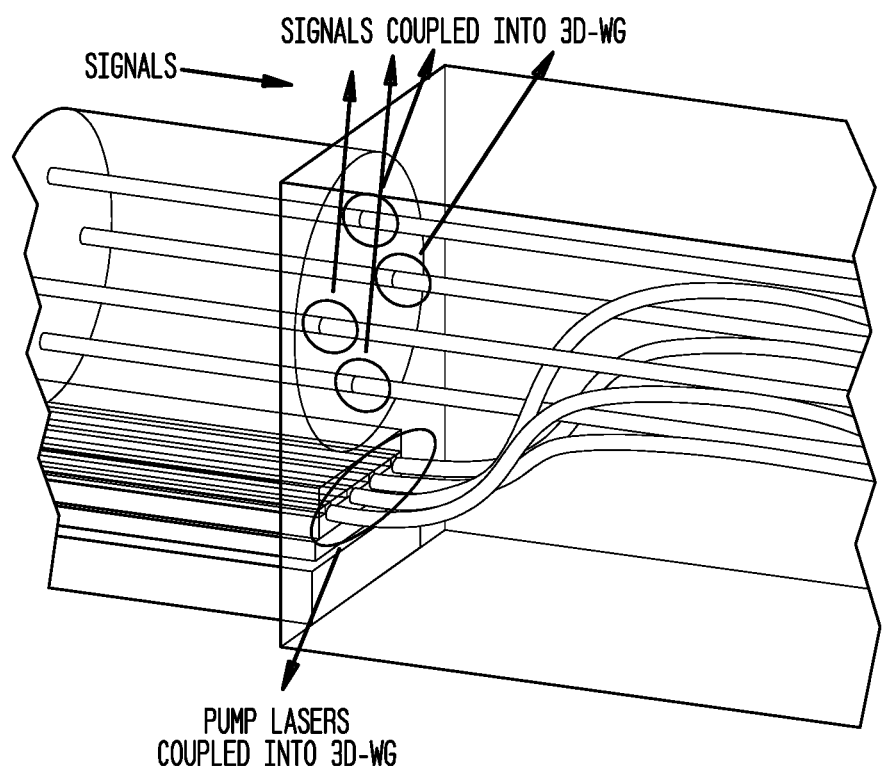

Turning now to FIG. 9(A) and FIG. 9(B), there is shown a series of schematic diagrams of an illustrative configuration in which optical signals and optical pumps are coupled into the 3D waveguide. As may be observed, the pump laser light and input optical signals to be amplified are launched into the 3D waveguide and the pump light is coupled into a respective one of the individual signal waveguides. One useful method to couple the pump light into a respective waveguide conveying signal light is by positioning the pump waveguide sufficiently proximate to the signal waveguide such that the pump light is transferred (coupled) to the signal waveguide core(s). As is known in the optical communications art, coupling two different light(s) with different wavelength is generally referred to as WDM coupling.

Figure 10A:
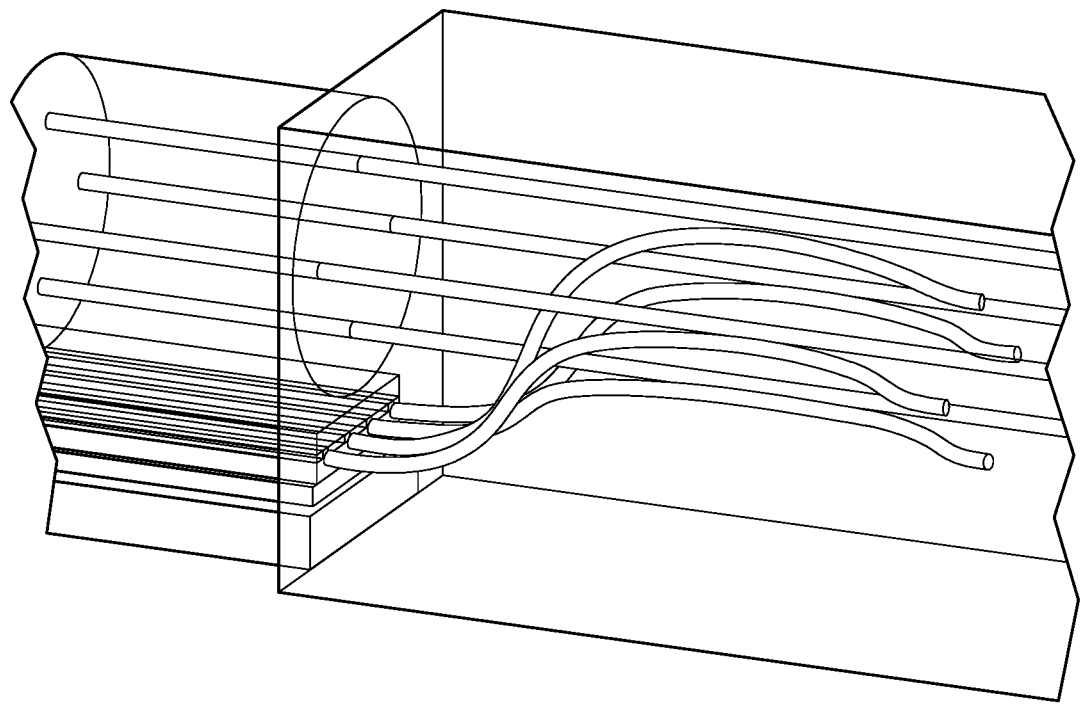
FIG. 10(A) and FIG. 10(B) is a series of schematic diagrams illustrating how signals and pumps are coupled into a 3D waveguide according to aspects of the present disclosure.
Figure 10B:
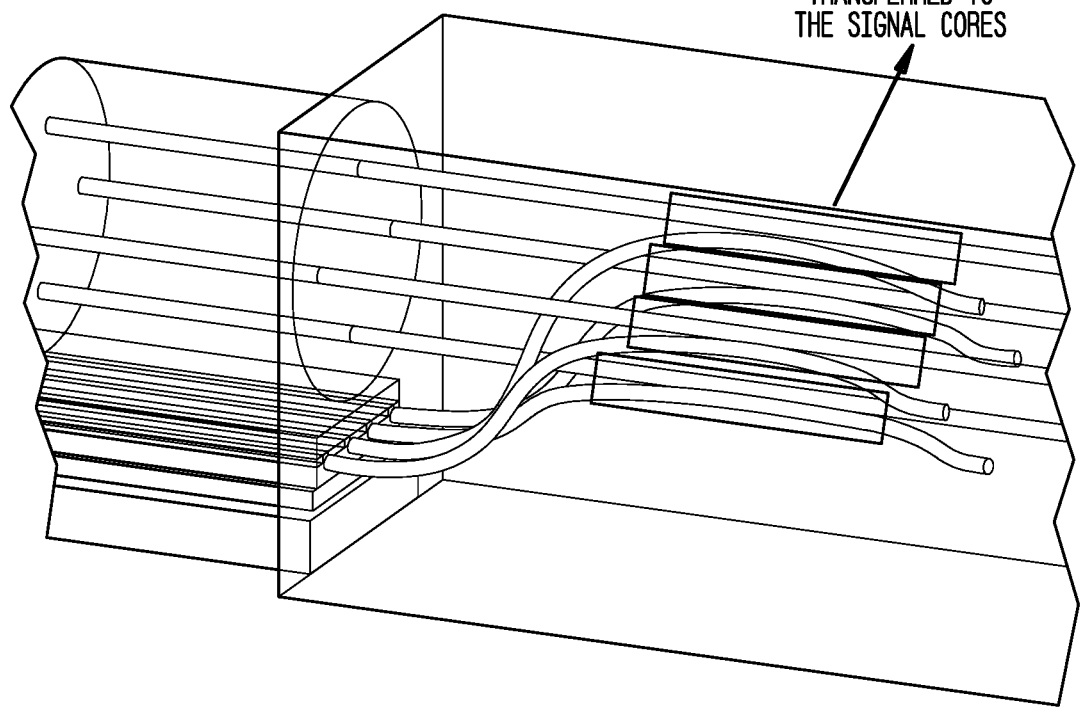

There are several known techniques to achieve such WDM coupling. FIG. 10(A) and FIG. 10(B) is a series of schematic diagrams illustrating how signals and pumps are coupled in the 3D waveguide. As may be observed, pump light from a respective one of the MC-LD laser is coupled into a respective waveguide of the 3D waveguide for amplification.

Figure 11A:
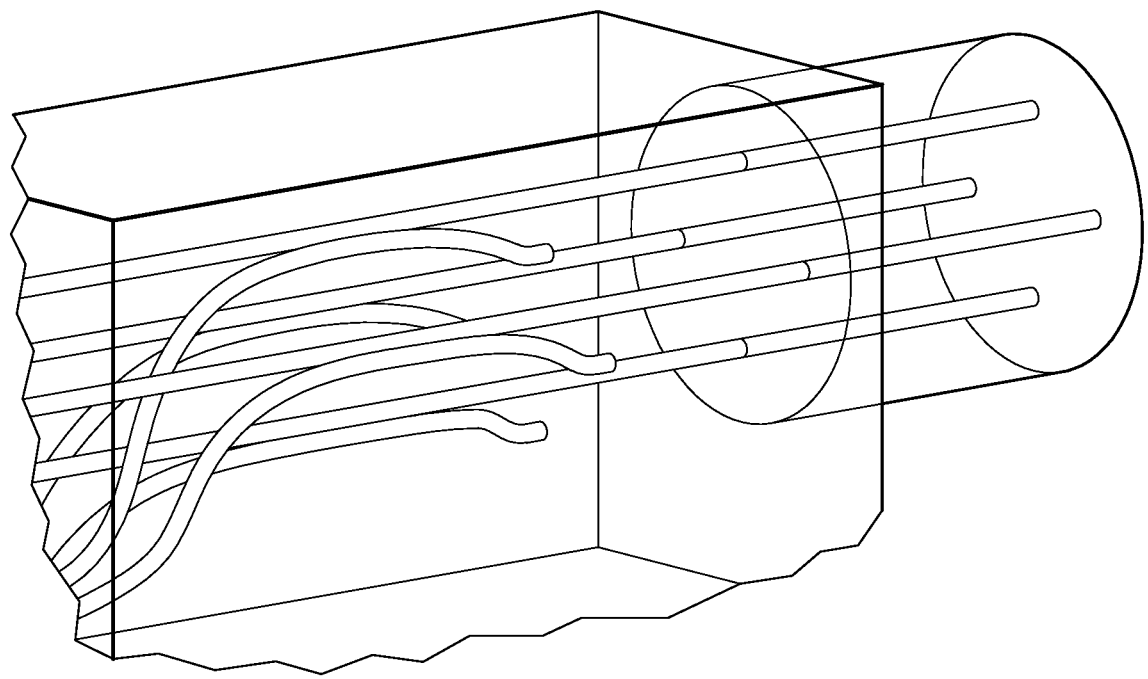
FIG. 11(A) and FIG. 11(B) is a series of schematic diagrams illustrating how combined signals and pumps are coupled into a MD-EDF waveguide—each into a corresponding core—according to aspects of the present disclosure.
Figure 11B:
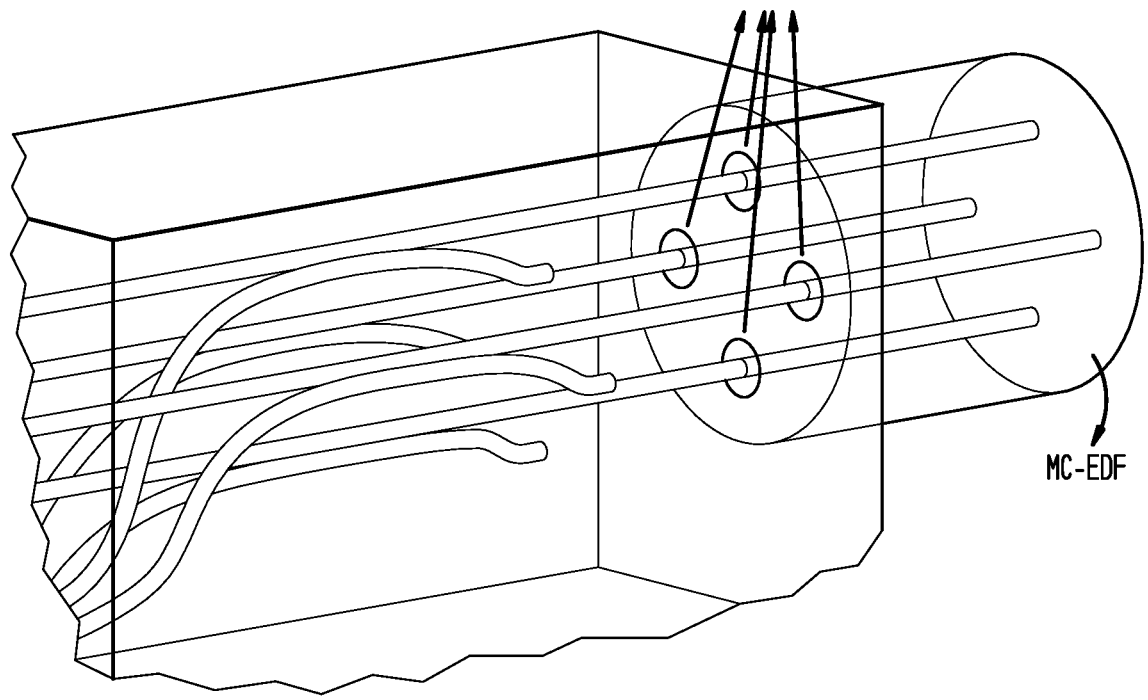

Continuing, FIG. 11(A) and FIG. 11(B) is a series of schematic diagrams showing an illustrative configuration in which the combined pump light and signal light is coupled into a multicore Erbium-doped Fiber (MC-EDF amplifier) wherein each of the MC-EDF is associated with and coupled to a respective core carrying a respective signal and respective pump light.

We note at this point there are a number of variations to the design illustrated. For instance, it is not necessary that one employ such a MC-EDF. In particular, it is possible to employ four (in this example) separate single-core EDFs. In such configuration, each EDF core would be matched to each core inside the 3D-WG. Similarly, it is not necessary to have multi core fiber at the input of the 3D-WG. Instead, it is possible to employ 4 separate single-core fibers—each of which is matched to one core of the 3D-WG. Finally, it is also not necessary to employ the same number of cores for the MC-EDF and MC-LD. For instance, one may employ a 2-core MC-LD and inside the 3D-WG, one can split the laser power into two separate waveguides, totaling 4 waveguides inside the 4D-WG.

Figure 12:
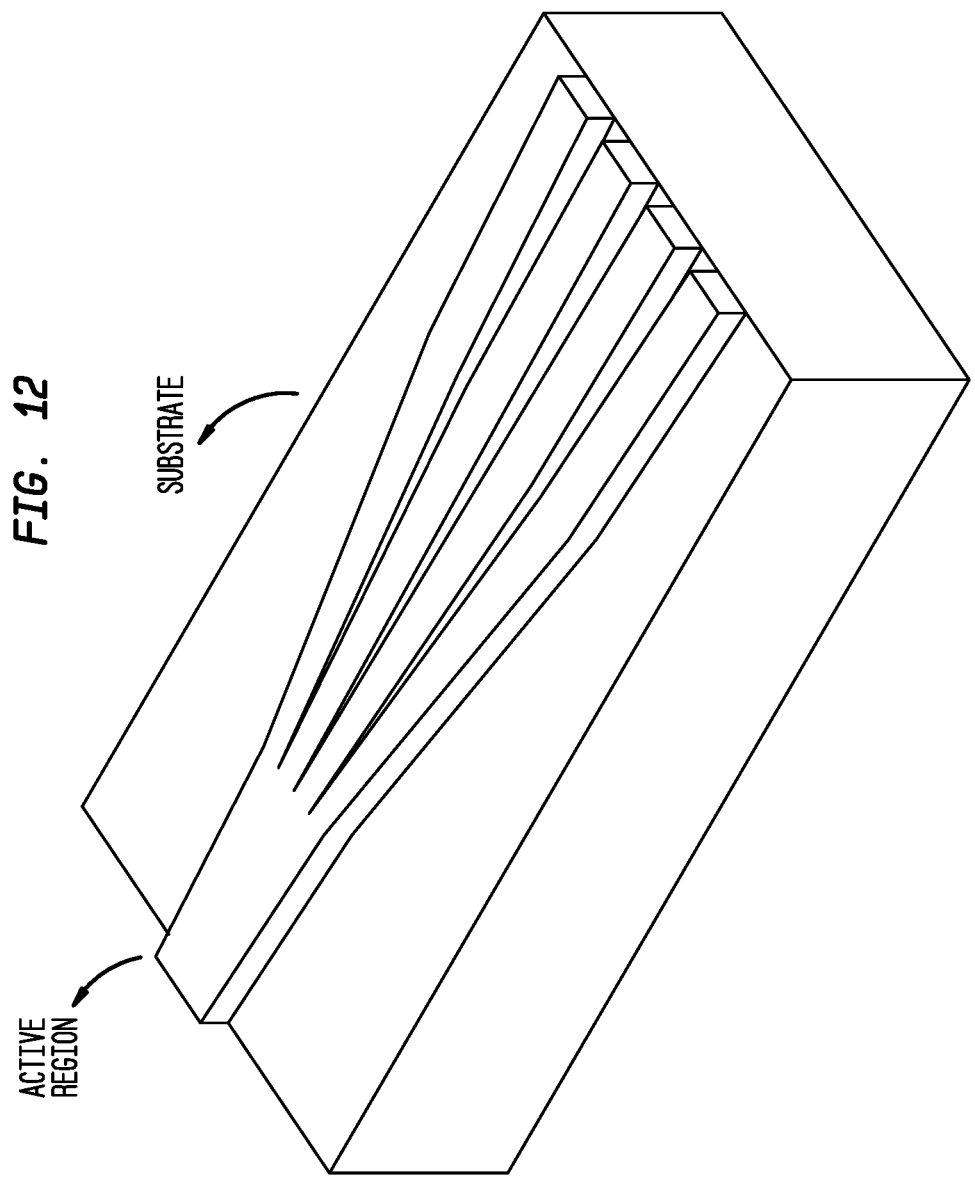
FIG. 12 a schematic diagram showing a perspective view of an illustrative laser diode (LD) with multiple laser outputs each of which exhibits single-mode or nearly single-mode output according to aspects of the present disclosure.

Finally, FIG. 12, is a schematic diagram showing an additional illustrative example of a LD with multiple laser outputs each of which has single-mode or nearly single-mode characteristics. Note that the active region of such a structure may advantageously exhibit different geometries. In particular—while a tapered and branched design is shown illustratively—the design of FIG. 12 may be extended to known master oscillator power amplifier (MOPA) configurations. Note further that even though the example presented herein is done in the context of erbium-doped fiber amplifiers—it is noted that the structure(s) may be extended to other applications with other fiber amplifiers that include dopants other than Erbium. For instance, ytterbium-doped fiber amplifiers, or erbium-ytterbium co-doped fiber amplifiers may be equally employed according to the present invention. Such configurations would be particularly beneficial in applications where there is more than one amplifier employed.

At this point, while we have presented this disclosure using some specific examples, those skilled in the art will recognize that our teachings are not so limited. Accordingly, this disclosure should be only limited by the scope of the claims attached hereto.

The invention claimed is:

1. A multicore fiber amplifier comprising:
a multicore optical fiber, each individual optical fiber of the multicore optical being rare-earth doped to provide optical amplification in response to optical pumping thereof;
a multicore laser diode for generating multiple optical pump signals, each individual core of the multicore laser diode generating pump signals at pump wavelengths;
wherein the multicore laser diode is optically coupled to the multicore optical fiber and configured such that pump signals generated by each individual core of the multicore laser diode are respectively coupled to an individual core of the multicore optical fiber;
wherein the pump signals generated by each individual core of the multicore laser diode are individually and respectively coupled to an individual, respective core of the multicore optical fiber by a 3D waveguide section, interposed between two sections of the multicore optical fiber.

2. The multicore fiber amplifier of claim 1 wherein the multicore laser diode comprises a plurality of narrow gain strips each one of the plurality of narrow gain strips configured to operate as a single-mode laser and emit a single-mode pump signal.

3. The multicore fiber amplifier of claim 2 configured such that each one of the narrow gain strips is optically coupled to a respective one core of the multicore optical fiber.

4. The multicore fiber amplifier of claim 3 further comprising an input multicore optical fiber optically coupled to the rare-earth doped multicore optical fiber, said input multicore optical fiber respectively communicating optical signals to the rare-earth doped multicore optical fiber wherein they are optically amplified.

5. The multicore fiber amplifier of claim 4 wherein the multicore laser diode exhibits a branched geometry.

6. The multicore fiber amplifier of claim 4 wherein the multicore laser diode exhibits a tapered geometry.

7. The multicore fiber amplifier of claim 6 wherein the rare-earth dopants are ones selected from the group consisting of erbium, ytterbium, and erbium-ytterbium.

8. A method of amplifying an optical signal comprising:
applying a plurality of pump signals to a multicore optical fiber, said multicore optical fiber being doped with rare-earth ions;
applying respectively to the multicore optical fiber a plurality of optical signals for amplification, one signal applied to each core;
wherein said pump signals generated from operation of a multicore laser diode that outputs a plurality of single mode pump signals, one pump signal for each core of the multicore optical fiber; are individually and respectively coupled to an individual, respective core of the multicore optical fiber by a 3D waveguide section.

* * * * *